United States Patent
Koga

(10) Patent No.: US 11,418,018 B2
(45) Date of Patent: Aug. 16, 2022

(54) ARC DETECTION CIRCUIT, SWITCH SYSTEM, POWER CONDITIONER SYSTEM AND ARC DETECTION METHOD

(71) Applicant: Panasonic Intellectual Property Management Co., Ltd., Osaka (JP)

(72) Inventor: Tatsuo Koga, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 527 days.

(21) Appl. No.: 16/483,415

(22) PCT Filed: Jan. 31, 2018

(86) PCT No.: PCT/JP2018/003201
§ 371 (c)(1),
(2) Date: Aug. 3, 2019

(87) PCT Pub. No.: WO2018/150876
PCT Pub. Date: Aug. 23, 2018

(65) Prior Publication Data
US 2020/0014189 A1    Jan. 9, 2020

(30) Foreign Application Priority Data
Feb. 14, 2017    (JP) .............................. JP2017-025457

(51) Int. Cl.
*H02H 1/00*   (2006.01)
*H02H 3/24*   (2006.01)
*H02H 5/04*   (2006.01)

(52) U.S. Cl.
CPC ........ *H02H 1/0015* (2013.01); *H02H 1/0061* (2013.01); *H02H 3/24* (2013.01); *H02H 5/04* (2013.01)

(58) Field of Classification Search
CPC ...... H02H 1/0015; H02H 1/0061; H02H 3/24; H02H 5/04; G01R 31/00; G01R 31/12
See application file for complete search history.

(56) References Cited

U.S. PATENT DOCUMENTS

2011/0181296 A1* 7/2011 Kolker ................. H02H 3/162
324/551
2016/0181799 A1* 6/2016 Kanemaru ............. H02M 7/44
307/78
(Continued)

FOREIGN PATENT DOCUMENTS

JP        2605279 A      2/1997
JP     2000-117146 A     4/2000
(Continued)

OTHER PUBLICATIONS

International Search Report (ISR) dated Apr. 17, 2018 in International (PCT) Application No. PCT/JP2018/003201.
(Continued)

*Primary Examiner* — Akm Zakaria
(74) *Attorney, Agent, or Firm* — Renner, Otto, Boisselle & Sklar, LLP

(57) ABSTRACT

An arc detection circuit includes: a current detector that detects a current supplied from a power supply apparatus via a transmission path; a voltage detector that detects a voltage applied to the transmission path; and an arc determination unit configured to determine whether an arc has occurred in the transmission path based on the voltage, when one or more particular frequency components of the current exceed a first threshold.

7 Claims, 8 Drawing Sheets

(56) References Cited

U.S. PATENT DOCUMENTS

| | | | | |
|---|---|---|---|---|
| 2016/0282398 A1* | 9/2016 | Zhu | ................. | H02S 50/10 |
| 2016/0351042 A1* | 12/2016 | Chae | ................. | G01R 31/1272 |
| 2018/0233901 A1* | 8/2018 | Ashida | ................. | H02H 7/20 |

FOREIGN PATENT DOCUMENTS

| | | |
|---|---|---|
| JP | 2000-298153 A | 10/2000 |
| JP | 2002-125310 A | 4/2002 |
| JP | 2011-7765 A | 1/2011 |
| JP | 2014134445 A | 7/2014 |
| JP | 2015145847 A | 8/2015 |

OTHER PUBLICATIONS

Written Opinion dated Apr. 17, 2018 in International (PCT) Application No. PCT/JP2018/003201.
Office Action for corresponding JP Application No. 2018-568090 dated Dec. 22, 2020.

\* cited by examiner

ARC DETECTION CIRCUIT, SWITCH SYSTEM, POWER CONDITIONER SYSTEM AND ARC DETECTION METHOD

TECHNICAL FIELD

The present invention relates to an arc detection circuit, a switch system, a power conditioner system, and an arc detection method that detect an arc in a transmission path.

BACKGROUND ART

Conventionally, a system has been known that converts, by a power conditioner, direct-current power supplied from a power supply apparatus via a transmission path, such as a photovoltaic (PV) panel, into alternating-current power. Since the transmission path that connects the PV panel and the power conditioner is often placed outside, the transmission path deteriorates easily. Such deterioration of the transmission path may cause an arc (i.e., arc discharge). In order to interrupt the current that flows through a transmission path when an arc occurs, a switch is provided in the transmission path. However, when an arc has occurred, the current sometimes does not flow large enough to cause the switch to trip. Thus, the current may continue to flow through the transmission path when an arc has occurred. In view of the above, an arc detection means for detecting an arc has been proposed (for example, Patent Literature (PTL) 1). The arc detection means disclosed in PTL 1 tries to detect an arc based on the voltage and the current that are applied to the transmission path.

CITATION LIST

Patent Literature

PTL 1: Japanese Unexamined Patent Application Publication No. 2011-7765

SUMMARY OF THE INVENTION

Technical Problem

However, the arc detection means disclosed in PTL 1 cannot sufficiently distinguish between changes in voltage and current due to an arc, and changes in voltage and current due to other factors such as noise other than an arc.

In view of the above, an object of the present invention is to provide an arc detection circuit, etc. that can accurately detect an arc that occurs in the transmission path that transmits power from a power supply apparatus.

Solution to Problem

In order to achieve the above object, an arc detection circuit according to one aspect of the present invention is an arc detection circuit including: a current detector that detects a current supplied from a power supply apparatus via a transmission path; a voltage detector that detects a voltage applied to the transmission path; and an arc determination unit configured to determine whether an arc has occurred in the transmission path based on the voltage, when one or more particular frequency components of the current exceed a first threshold.

Furthermore, in order to achieve the above object, a switch system according to one aspect of the present invention includes: the arc detection circuit; and a switch that is controlled based on a signal outputted from the arc detection circuit.

Furthermore, in order to achieve the above object, a power conditioner system according to one aspect of the present invention includes: the arc detection circuit; and a power conditioner to which power from the power supply apparatus is supplied via the transmission path.

Furthermore, in order to achieve the above object, an arc detection method according to one aspect of the present invention includes: detecting a current supplied from a power supply apparatus via a transmission path; detecting a voltage applied to the transmission path; and determining that an arc has occurred in the transmission path based on the voltage, when one or more particular frequency components of the current exceed a first threshold.

Advantageous Effect of Invention

According to one aspect of the present invention, it is possible to provide an arc detection circuit, etc. that can accurately detect an arc that occurs in the transmission path that transmits power from a power supply apparatus.

DESCRIPTION OF EXEMPLARY EMBODIMENTS

Figure 1:
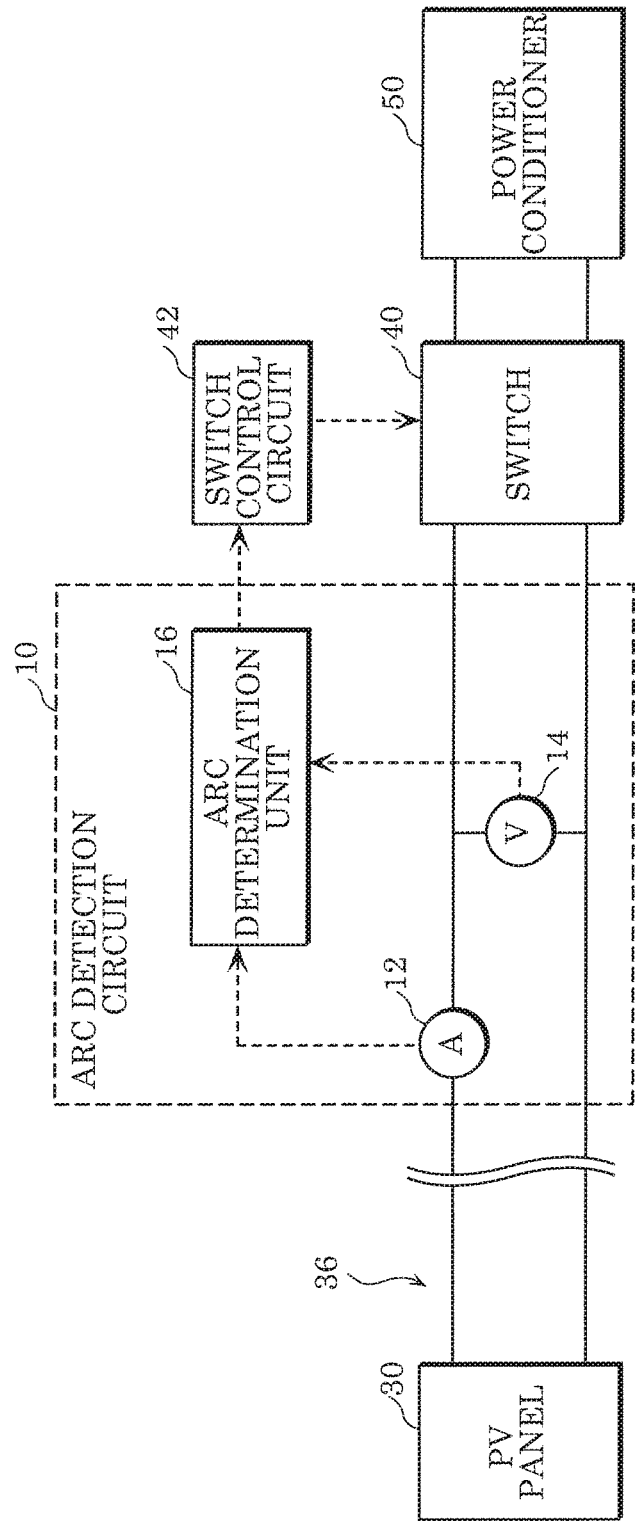
FIG. 1 is a block diagram illustrating an overall configuration of an arc detection circuit according to Embodiment 1.

Hereinafter, embodiments of the present invention are described with reference to the drawings. The embodiments described below each show a specific example of the present invention. Therefore, the numerical values, shapes, materials, structural elements, and the positioning and connection of the structural elements, for instance, presented in the following embodiments are mere examples, and thus are not intended to limit the present invention. Therefore, among the structural elements in the embodiment below, structural elements not recited in any one of independent claims which indicate the broadest concepts of the present disclosure are described as optional structural elements.

Note that the respective drawings are schematic illustrations and are not necessarily precise illustrations. Additionally, structural elements that are essentially the same share like reference numerals in the respective drawings, and overlapping explanations thereof are omitted or simplified.

Embodiment 1

[1-1. Overall Configuration]

An overall configuration of an arc detection circuit according to Embodiment 1 will be described with reference to the drawings.

FIG. 1 is a block diagram illustrating the overall configuration of arc detection circuit 10 according to the present embodiment. Note that FIG. 1 illustrates transmission path 36 in which arc detection circuit 10 is provided, PV panel 30 connected to transmission path 36, switch 40, power conditioner 50, and switch control circuit 42 that switches between opening and closing of switch 40.

PV panel 30 is an example of a power supply apparatus that outputs direct-current power to transmission path 36. Note that, although PV panel 30 is used as an example of the power supply apparatus in the present embodiment, the power supply apparatus is not limited to PV panel 30. For example, the power supply apparatus may be a power generating apparatus other than PV panel 30.

Transmission path 36 includes power lines that transmit the direct-current power outputted from the power supply apparatus, for example, PV panel 30, to power conditioner 50. Transmission path 36 includes lead wires made of a conductive material such as copper, and coating made of an insulating material that protects the lead wires. For example, an arc may occur when the coating deteriorates.

Switch 40 is an electric device that switches between opening and closing of transmission path 36. In the present embodiment, switch 40 switches between opening and closing based on the signal from switch control circuit 42.

Switch control circuit 42 is a driver that controls opening and closing of switch 40. In the present embodiment, switch control circuit 42 controls opening and closing of switch 40, based on a signal from arc detection circuit 10.

Power conditioner 50 is a device to which the direct-current power outputted from the power supply apparatus is supplied via transmission path 36, and power conditioner 50 converts the supplied direct-current power into alternating-current power, and outputs the alternating-current power. In the present embodiment, for example, power conditioner 50 uses a maximum power point tracking (MPPT) method. Power conditioner 50 adjusts the current and the voltage of the direct-current power supplied from PV panel 30 to values that maximize the power. Power conditioner 50 converts the inputted direct-current power into alternating-current power having a voltage of 100 V and a frequency of 50 Hz or 60 Hz, for example. Accordingly, the alternating-current power outputted from power conditioner 50 can be used by a home electric appliance, etc.

Arc detection circuit 10 is a circuit that detects an arc that occurs in transmission path 36 that transmits power to power conditioner 50 from the power supply apparatus. Arc detection circuit 10 includes current detector 12, voltage detector 14, and arc determination unit 16.

Current detector 12 is a detector that detects a current supplied from the power supply apparatus via transmission path 36. In the present embodiment, current detector 12 detects the current supplied from PV panel 30, and outputs a signal corresponding to the detected current to arc determination unit 16. Current detector 12 may include, for example, a resistance element having an extremely small resistance value. A value corresponding to the current flowing through transmission path 36 can be detected by inserting such a resistance element in transmission path 36, and detecting the voltage applied to the resistance element.

Voltage detector 14 is a detector that detects a voltage applied to transmission path 36. For example, voltage detector 14 detects the voltage applied between the power line at a higher potential and the power line at a lower potential of transmission path 36, and outputs a signal corresponding to the detected voltage to arc determination unit 16.

Arc determination unit 16 is a processing unit that determines whether an arc has occurred in transmission path 36 based on the voltage detected by voltage detector 14, when one or more particular frequency components of the current detected by current detector 12 exceed a first threshold.

The current signal corresponding to the current flowing through transmission path 36 is inputted to arc determination unit 16 by current detector 12, and arc determination unit 16 analyzes the frequency characteristic of the current signal. Arc determination unit 16 obtains a frequency spectrum of the current signal by Fourier-transforming the time waveform of the current signal, for example. Arc determination unit 16 compares one or more particular frequency components of the current with the first threshold based on the obtained frequency spectrum. Note that the one or more particular frequency components and the first threshold will be described later.

Moreover, arc determination unit 16 compares a second threshold with a decreased voltage which is a difference between a voltage detected by voltage detector 14 immediately before the one or more particular frequency components of the current detected by current detector 12 exceed the first threshold and a voltage immediately after the one or more particular frequency components of the current detected by current detector 12 exceed the first threshold. Note that the second threshold will be described later.

As described above, arc determination unit 16 determines whether an arc has occurred based on the result of the comparison between the one or more particular frequency components of the current and the first threshold, and the result of the comparison between the decreased voltage and the second threshold.

Arc determination unit 16 outputs a signal to switch control circuit 42, when arc determination unit 16 determines that an arc has occurred. Accordingly, a signal for causing switch 40 to be an open state is outputted from switch control circuit 42. This switches switch 40 to the open state and transmission of the power from PV panel 30 to power conditioner 50 is interrupted. This can reduce or prevent a situation in which the power is kept transmitted while an arc is present.

Arc determination unit 16 is implemented by a microcontroller unit (MCU), for example. The microcontroller unit is a one-chip semiconductor integrated circuit having an input and output circuit including read-only memory (ROM) in which a program is stored, random-access memory (RAM), a processor (central processing unit; CPU) that executes the program, a timer, an analog-to-digital converter (A to D converter), a digital-to-analog converter (D to A converter), and so on.

[1-2. Operation]

Next, operation of arc detection circuit 10 according to the present embodiment will be described with reference to the drawings.

Figure 2:
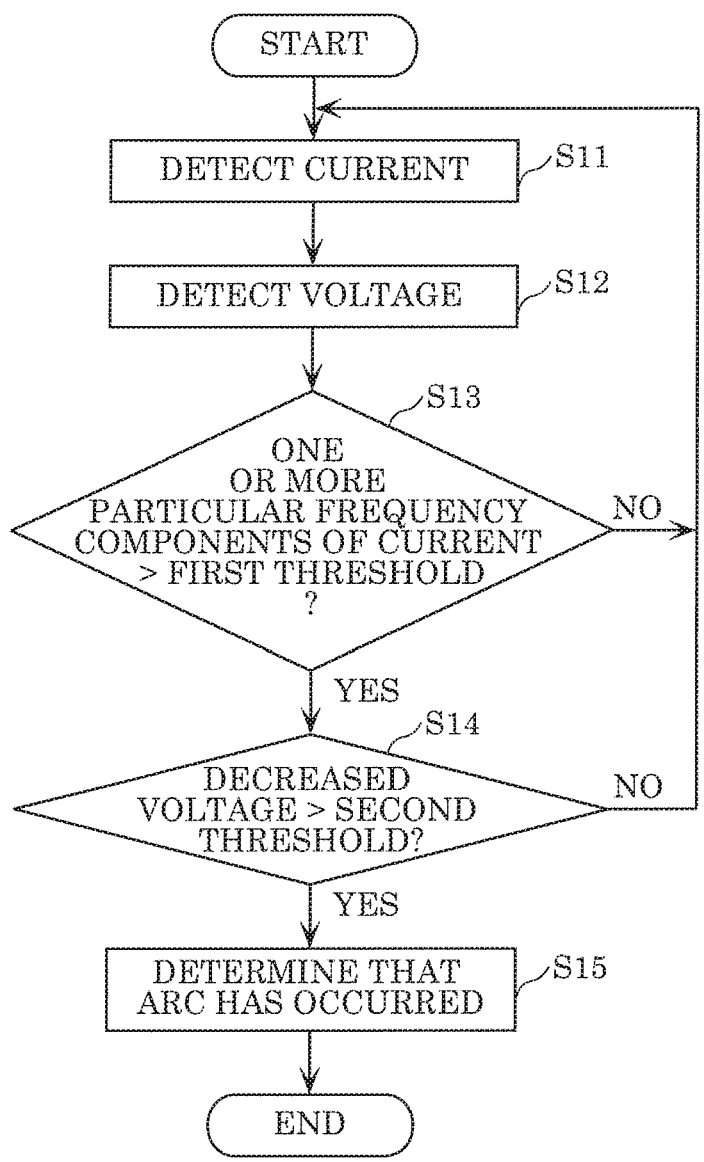
FIG. 2 is a flowchart illustrating an arc detection method performed by the arc detection circuit according to Embodiment 1.
Figure 3:
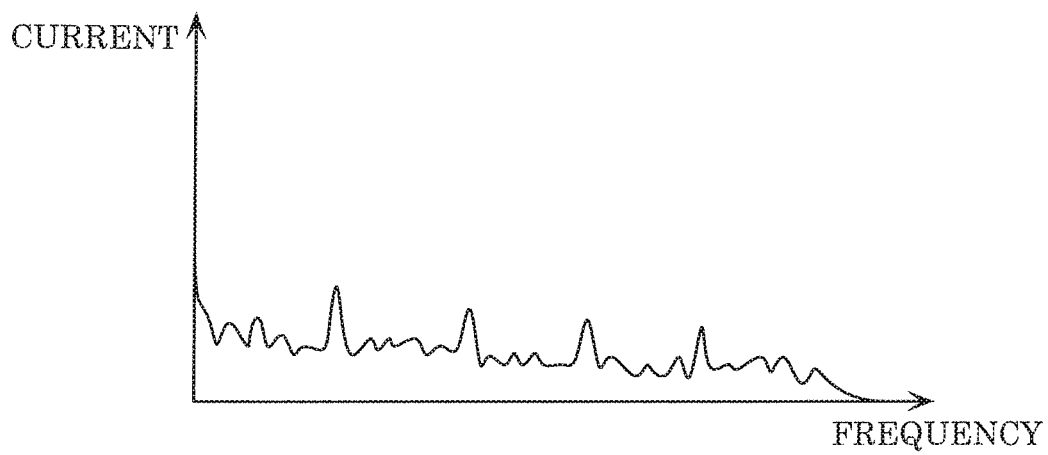
FIG. 3 is a graph showing an example of a frequency spectrum of a current obtained by an arc determination unit according to Embodiment 1 when an arc is not present.
Figure 4:
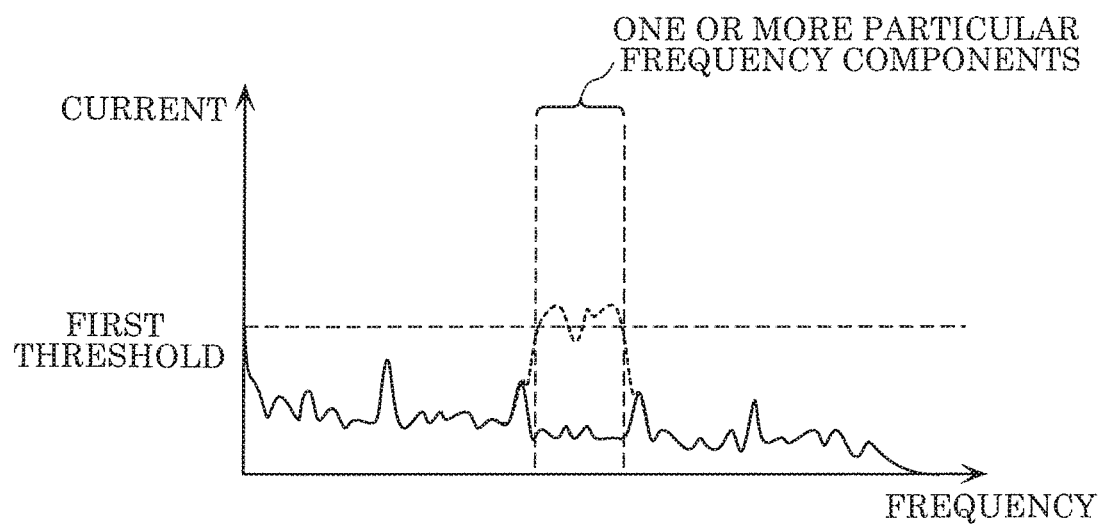
FIG. 4 is a graph showing a first threshold and one or more particular frequency components compared with one another by the arc determination unit according to Embodiment 1.

FIG. 2 is a flowchart illustrating an arc detection method performed by arc detection circuit 10 according to the present embodiment. FIG. 3 is a graph showing an example of a frequency spectrum of a current obtained by arc determination unit 16 according to the present embodiment when an arc is not present. FIG. 4 is a graph showing the first threshold and one or more particular frequency components compared with one another by arc determination unit 16 according to the present embodiment. Note that FIG. 4 shows, as a dotted line, an example of the frequency spectrum of the current that is generated when an arc is present.

As illustrated in FIG. 2, current detector 12 in arc detection circuit 10 detects the current supplied from the power supply apparatus via transmission path 36 (S11). In the present embodiment, current detector 12 detects a current supplied from PV panel 30, which is an example of the power supply apparatus, and the current signal corresponding to the detected current is outputted to arc determination unit 16.

Subsequently, voltage detector 14 in arc detection circuit 10 detects a voltage applied to transmission path 36 (S12). In the present embodiment, voltage detector 14 outputs the voltage signal corresponding to the detected voltage to arc determination unit 16.

Subsequently, arc determination unit 16 determines whether one or more particular frequency components of the current detected by current detector 12 exceed the first threshold (S13). Current detector 12 inputs a current signal corresponding to the current flowing through transmission path 36 to arc determination unit 16. Arc determination unit 16 obtains a frequency spectrum of the current signal such as those shown in FIG. 3 and FIG. 4 by Fourier-transforming the time waveform of the current signal, for example. Arc determination unit 16 compares the one or more particular frequency components of the current with the first threshold, based on the obtained frequency spectrum.

The one or more particular frequency components of the current detected by current detector 12 are frequency components including noise added to the current flowing through transmission path 36 when an arc is present in transmission path 36, as illustrated in FIG. 4. When an arc occurs in transmission path 36, noise having a specific frequency band increases.

The first threshold shown in FIG. 4 is a standard value for determining whether an arc has occurred. As shown by the dotted line plotted on the graph in FIG. 4, the one or more particular frequency components of the current exceed the first threshold when an arc has occurred. The first threshold is obtained through an experiment, for example. For example, the first threshold may be determined as a value greater than the values of the one or more particular frequency components when an arc is not present and less than the values of the one or more particular frequency components when an arc is present.

Referring back to FIG. 2, when arc determination unit 16 determines that the one or more particular frequency components of the current do not exceed the first threshold (NO in S13), the operation returns to Step S11.

On the other hand, when arc determination unit 16 determines that the one or more particular frequency components of the current exceed the first threshold (YES in S13), arc determination unit 16 compares the second threshold with the decreased voltage detected by voltage detector 14 (S14). When an arc has occurred in transmission path 36, the voltage applied to transmission path 36 decreases. Thus, in the present embodiment, the decreased voltage is detected by obtaining a difference between a voltage detected by voltage detector 14 immediately before the one or more particular frequency components exceed the first threshold and a voltage detected by voltage detector 14 immediately after the one or more particular frequency components exceed the first threshold (i.e., voltage difference obtained by subtracting the voltage immediately after the one or more particular frequency components exceed the first threshold from the voltage immediately before the one or more particular frequency exceed the first threshold). Arc determination unit 16 compares the decreased voltage with the second threshold. For example, the second threshold is determined as a value greater than or equal to zero and less than the decreased voltage when an arc has occurred. The decreased voltage is obtained in advance through an experiment and a simulation, for example. When the decreased voltage is less than or equal to the second threshold, it is inferred that an arc has not occurred. When the decreased voltage is greater than the second threshold, it is inferred that an arc has occurred. Thus, when arc determination unit 16 determines that the decreased voltage detected by voltage detector 14 is less than or equal to the second threshold (NO in S14), arc determination unit 16 determines that an arc has not occurred and the operation returns to Step S11. On the other hand, when arc determination unit 16 determines that the decreased voltage detected by voltage detector 14 is greater than the second threshold (YES in S14), arc determination unit 16 determines that an arc has occurred (S15). In other words, arc detection circuit 10 detects an arc. Arc determination unit 16 outputs a signal to switch control circuit 42, when arc determination unit 16 determines that an arc has occurred. Accordingly, switch 40 is switched to the open state by switch control circuit 42, and transmission of the power from PV panel 30 to power conditioner 50 is interrupted.

As described above, arc detection circuit 10 according to the present embodiment can accurately detect occurrence of an arc by using two criteria concerning change in the frequency spectrum of the current which is specific to the case where an arc is present, and change in the voltage. For example, when occurrence of an arc is inferred based on the change in the frequency spectrum and occurrence of an arc is not inferred based on the change in the voltage, it is determined that an arc has not occurred. This can reduce or prevent an erroneous determination that an arc has occurred when change has occurred in the frequency spectrum due to noise other than an arc.

[1-3. Conclusion]

As described above, arc detection circuit 10 according to the present embodiment includes: voltage detector 14 that detects a voltage applied to transmission path 36; and arc determination unit 16 configured to determine whether an arc has occurred in transmission path 36 based on the voltage, when one or more particular frequency components of the current exceed a first threshold.

As described above, arc detection circuit 10 according to the present embodiment can accurately detect occurrence of an arc by using two criteria concerning change in the frequency spectrum of the current which is specific to the case where an arc has occurred, and change in the voltage.

Furthermore, in arc detection circuit 10, arc determination unit 16 may determine that the arc has occurred when a decreased voltage is greater than the second threshold, the decreased voltage being a difference between a voltage immediately before the one or more particular frequency components of the current exceed the first threshold and a voltage immediately after the one or more particular frequency components of the current exceed the first threshold.

Accordingly, arc determination unit 16 compares the second threshold with the decreased voltage which is a difference between the voltage immediately before the one or more frequency components exceed the first threshold and the voltage immediately after the one or more frequency components exceed the first threshold. Here, when an arc has occurred in transmission path 36, the voltage applied to transmission path 36 decreases. Thus, when the decreased voltage is less than or equal to the second threshold, it can be determined that an arc has not occurred, and when the decreased voltage is greater than the second threshold, it can be determined that an arc has occurred. Thus, arc detection circuit 10 can detect occurrence of an arc more accurately.

Furthermore, the arc detection method according to the present embodiment includes: detecting a current supplied from a power supply apparatus via transmission path 36; detecting a voltage applied to transmission path 36; and determining that an arc has occurred in transmission path 36 based on the voltage, when one or more particular frequency components of the current exceed a first threshold.

This achieves the same effects as the effects obtained with arc detection circuit 10.

Embodiment 2

Next, an arc detection circuit according to Embodiment 2 will be described. The arc detection circuit according to the present embodiment further uses the quantity of heat generated in transmission path 36 as another criterion in addition to the arc determination criteria used in arc detection circuit 10 according to Embodiment 1. Hereinafter, the arc detection circuit according to the present embodiment is described by focusing on the points different from arc detection circuit 10 according to Embodiment 1.

[2-1. Overall Configuration]

First, an overall configuration of the arc detection circuit according to the present embodiment is described with reference to the drawings.

Figure 5:
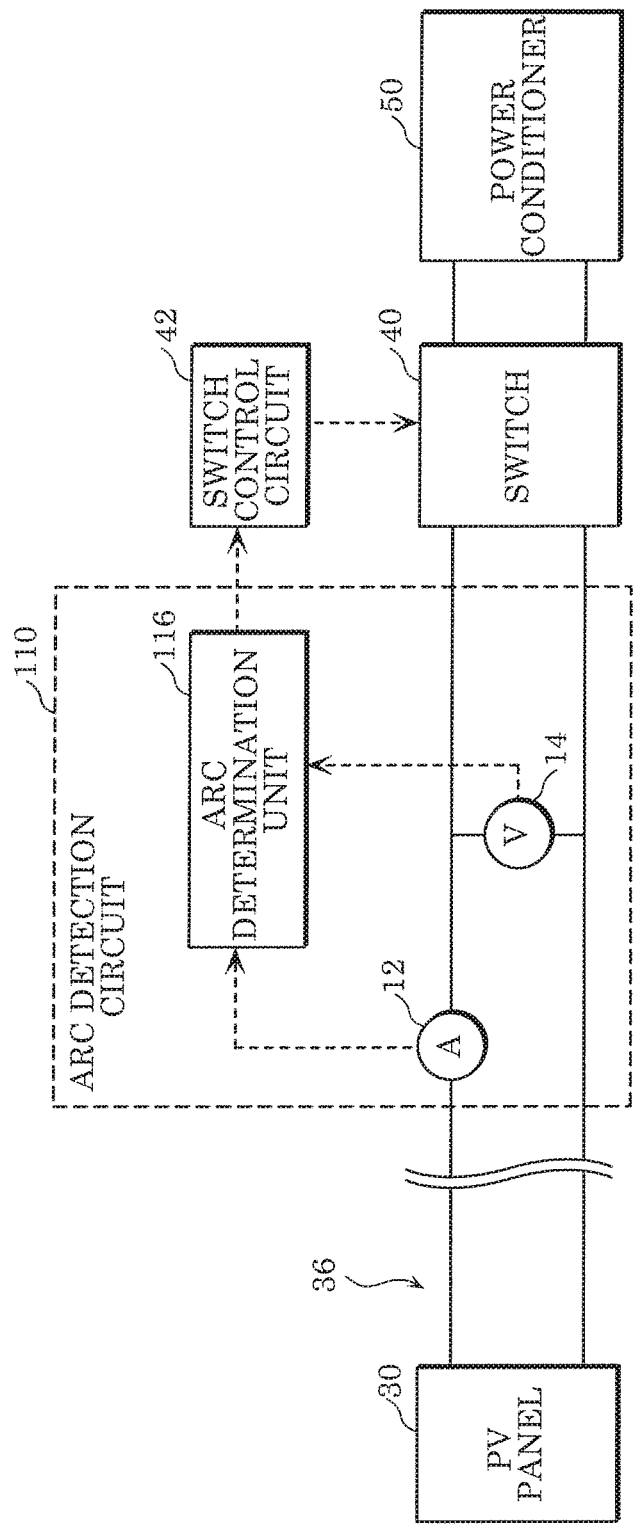
FIG. 5 is a block diagram illustrating an overall configuration of an arc detection circuit according to Embodiment 2.

FIG. 5 is a block diagram illustrating an overall configuration of arc detection circuit 110 according to the present embodiment.

As illustrated in FIG. 5, arc detection circuit 110 includes current detector 12, voltage detector 14, and arc determination unit 116, similar to arc detection circuit 10 according to Embodiment 1. Arc detection circuit 110 is different from arc detection circuit 10 according to Embodiment 1 in the configuration of arc determination unit 116.

Similar to arc determination unit 16, arc determination unit 116 is a processing unit that determines whether an arc has occurred in transmission path 36 based on the voltage detected by voltage detector 14, when one or more particular frequency components of the current detected by current detector 12 exceed the first threshold. In the present embodiment, arc determination unit 116 calculates the quantity of heat generated in transmission path 36 after a point in time when the one or more particular frequency components of the current detected by current detector 12 exceed the first threshold. More specifically, arc determination unit 116 calculates the quantity of heat based on the voltage detected by voltage detector 14, the current detected by current detector 12, and a time elapsed from the above-mentioned point in time. Arc determination unit 116 then determines whether an arc has occurred in the transmission path based on the result of a comparison between the calculated quantity of heat and a third threshold.

[2-2. Operation]

Next, operation of arc detection circuit 110 according to the present embodiment will be described with reference to the drawings.

Figure 6:
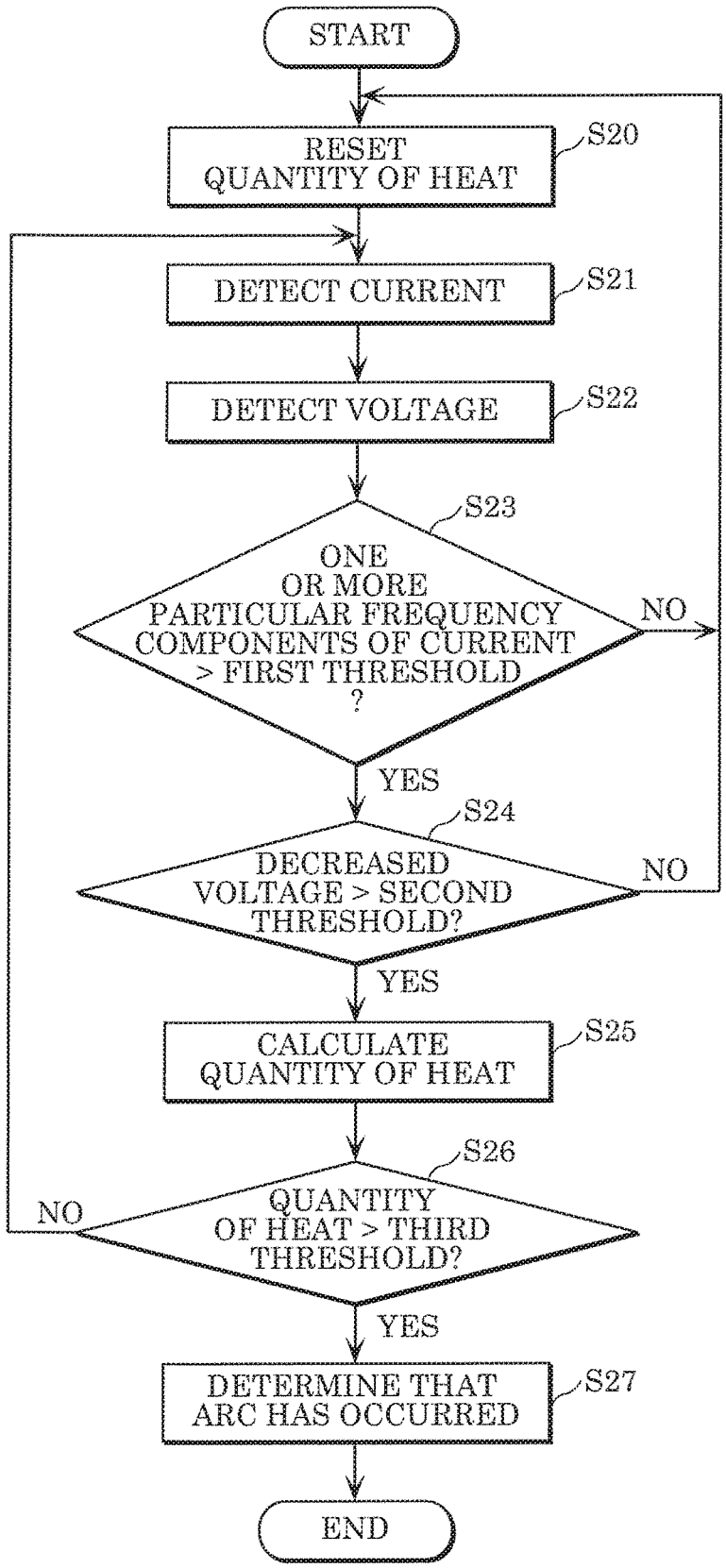
FIG. 6 is a flowchart illustrating an arc detection method performed by the arc detection circuit according to Embodiment 2.

FIG. 6 is a flowchart illustrating an arc detection method performed by arc detection circuit 110 according to the present embodiment.

As illustrated in FIG. 6, first, arc determination unit 116 of arc detection circuit 110 resets the quantity of heat stored therein to zero (S20).

Subsequently, current detector 12 in arc detection circuit 110 detects a current supplied from the power supply apparatus via transmission path 36 (S21). Current detector 12 outputs a current signal corresponding to the detected current to arc determination unit 116.

Subsequently, voltage detector 14 in arc detection circuit 110 detects a voltage applied to transmission path 36 (S22). In the present embodiment, voltage detector 14 outputs a voltage signal corresponding to the detected voltage to arc determination unit 116.

Subsequently, arc determination unit 116 determines whether the one or more particular frequency components of the current detected by current detector 12 exceed the first threshold (S23). Step S23 is the same as Step S13 shown in FIG. 2.

When arc determination unit 116 determines that one or more particular frequency components of the current do not exceed the first threshold (NO in S23), the operation returns to Step S20.

On the other hand, when arc determination unit 116 determines that the one or more particular frequency components of the current exceed the first threshold (YES in S23), arc determination unit 116 compares the second threshold with the decreased voltage detected by voltage detector 14 (S24). Step S24 is the same as Step S14 shown in FIG. 2.

When arc determination unit 116 determines that the decreased voltage detected by voltage detector 14 is less than or equal to the second threshold (NO in S24), arc determination unit 116 determines that an arc has not occurred and the operation returns to Step S20.

On the other hand, when arc determination unit 116 determines that the decreased voltage detected by voltage detector 14 is greater than the second threshold (YES in S24), arc determination unit 116 calculates the quantity of heat (S25). Arc determination unit 116 calculates the quantity of heat based on the current detected in Step S21, the voltage detected in Step S22, and a time elapsed from the point in time when the one or more particular frequency components of the current exceed the first threshold. For example, arc determination unit 116 calculates the product of the current detected in Step S21, the voltage detected in Step S22, and a time that it takes to perform from Step S21 to Step S26, which will be described later. Arc determination unit 116 calculates the sum of the calculated product and the stored quantity of heat, and stores the sum as an updated quantity of heat.

Subsequently, arc determination unit 116 compares the quantity of heat calculated in Step S25 with the third threshold (S26). Here, by using the quantity of heat allowed in transmission path 36 as the third threshold, a slight arc can be disregarded. The slight arc is an arc that generates a small quantity of heat and will not be a substantial problem in transmission path 36. This reduces or prevents arc detection circuit 110 from detecting an arc too sensitively. For example, the third threshold may be determined based on the quantity of heat that may cause ignition in transmission path 36. For example, a value approximately 1/10 of the quantity of heat that may cause ignition in transmission path 36 may be determined as the third threshold.

When arc determination unit 116 determines in Step S26 that the quantity of heat calculated in Step S25 is greater than the third threshold (YES in S26), arc determination unit 16 determines that an arc has occurred (S27). When arc determination unit 116 determines that an arc has occurred, arc determination unit 116 outputs a signal to switch control circuit 42, similar to arc determination unit 16 according to Embodiment 1.

On the other hand, when arc determine unit 116 determines in Step S26 that the quantity of heat calculated in Step S25 is less than or equal to the third threshold (NO in S26), arc determination unit 16 does not determine that an arc has occurred, and the operation returns to S21.

As described above, in arc detection circuit 110 according to the present embodiment, arc determination unit 116 calculates the quantity of heat generated in the transmission path after a point in time when the one or more particular frequency components are detected to exceed the first threshold, based on the voltage, the current, and a time elapsed from the point in time. Then, arc determination unit 116 determines whether an arc has occurred in transmission path 36 based on the result of a comparison between the quantity of heat and the third threshold, in addition to the result of a comparison between the voltage and the second threshold.

Accordingly, arc detection circuit 110 can detect occurrence of an arc still more accurately using the quantity of heat as another criterion in addition to the two criteria concerning change in the frequency spectrum of the current which is specific to the case where an arc has occurred, and change in the voltage. Furthermore, by using the amount of heat allowed in transmission path 36 as the third threshold, a slight arc that generates a small quantity of heat and will not be a problem in transmission path 36 can be disregarded. This reduces or prevents arc detection circuit 110 from detecting an arc too sensitively, and also reduces or prevents transmission path 36 from being interrupted frequently more than necessary.

Embodiment 3

Next, an arc detection circuit according to Embodiment 3 will be described. The arc detection circuit according to the present embodiment uses characteristic data of input currents and input voltages that may be inputted to transmission path 36 as another criterion for determining whether an arc has occurred, in addition to the criteria for determining whether an arc has occurred, which are used in arc detection circuit 10 according to Embodiment 1. Hereinafter, the arc detection circuit according to the present embodiment is described by focusing on the points different from arc detection circuit 10 according to Embodiment 1.

[3-1. Overall Configuration]

First, an overall configuration of the arc detection circuit according to the present embodiment is described with reference to the drawings.

Figure 7:
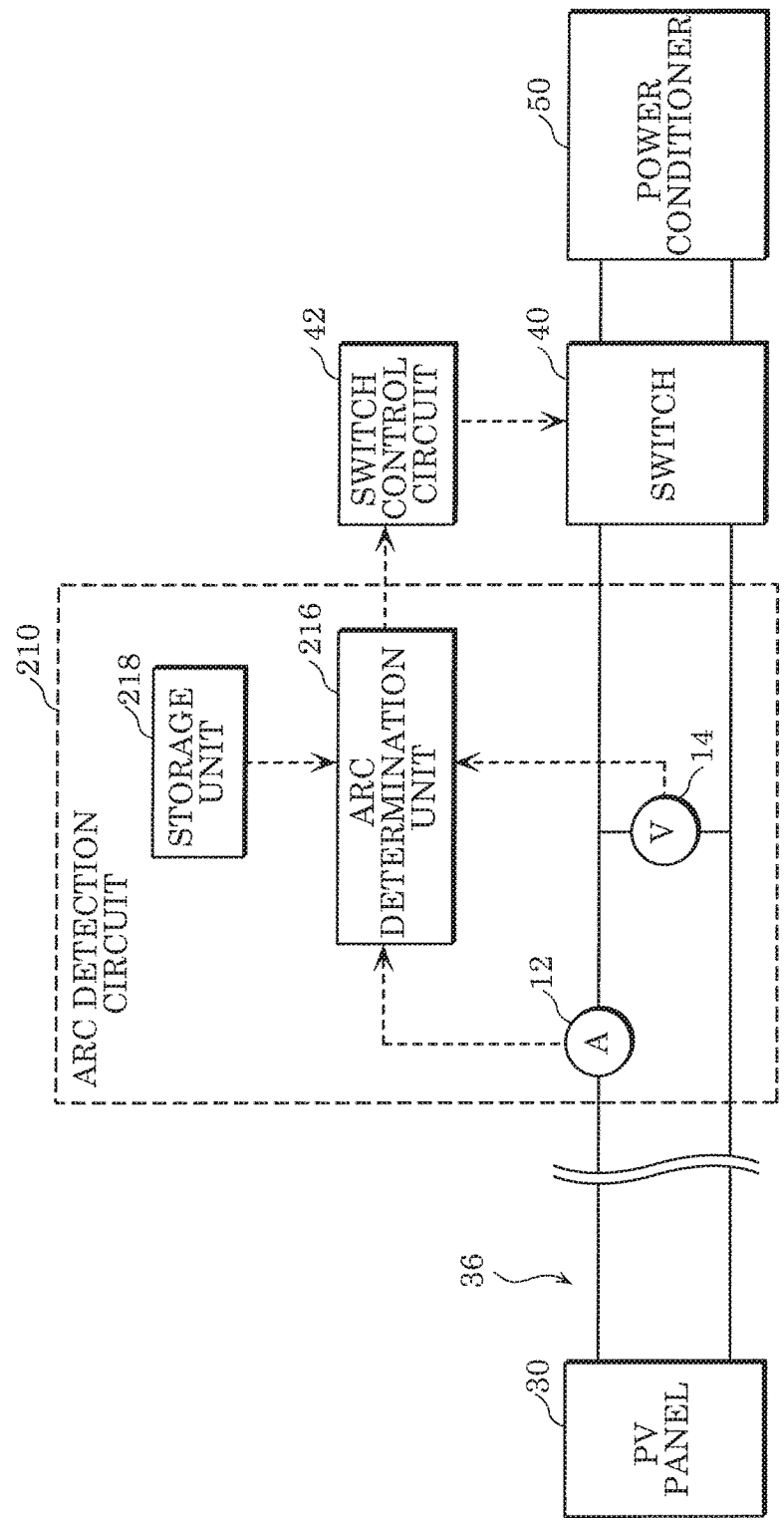
FIG. 7 is a block diagram illustrating an overall configuration of an arc detection circuit according to Embodiment 3.
Figure 8:
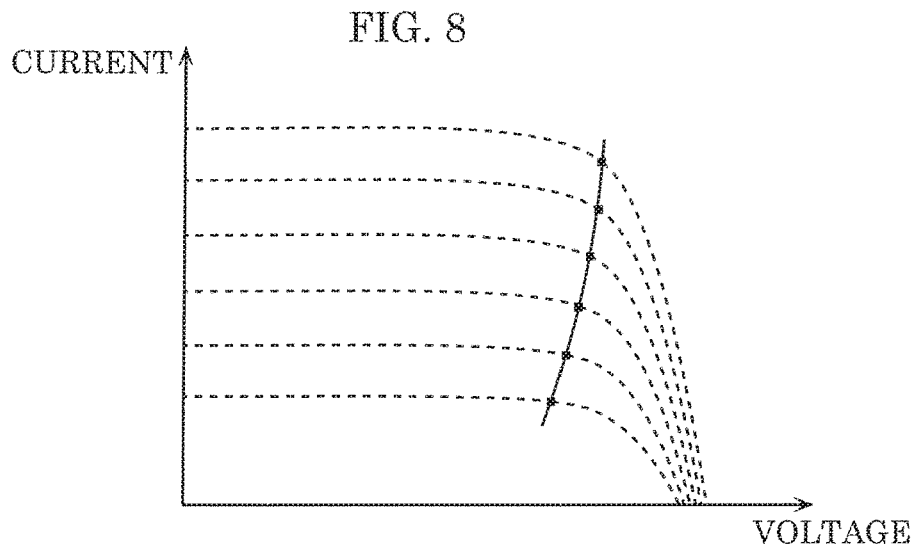
FIG. 8 is a graph showing relationships between input currents and input voltages that are to be inputted from a PV panel according to Embodiment 3 to a transmission path.

FIG. 7 is a block diagram illustrating an overall configuration of arc detection circuit 210 according to the present embodiment. FIG. 8 is a graph showing relationships between input currents and input voltages that may be inputted from PV panel 30 to transmission path 36 according to the present embodiment. FIG. 8 shows some of the characteristics of the currents and the voltages that may be outputted from PV panel 30 with dashed lines, and the points selected by power conditioner 50 as operating points are marked with squares on the dashed lines. In other words, the solid line connecting the operating points indicates relationships between the input currents and the input voltages from PV panel 30 to transmission path 36.

As illustrated in FIG. 7, arc detection circuit 210 according to the present embodiment includes current detector 12, voltage detector 14, and arc determination unit 216, similar to arc detection circuit 10 according to Embodiment 1. Arc detection circuit 210 further includes storage unit 218.

Storage unit 218 stores characteristic data indicating relationships between the input currents and the input voltages from the power supply apparatus to transmission path 36. This characteristic data is determined based on the characteristics of the power supply apparatus and power conditioner 50. PV panel 30 is used as the power supply apparatus in the present embodiment. Accordingly, characteristic data is combinations of the currents and the voltages shown as the solid line in FIG. 8. Storage unit 218 may store such characteristic data as a table, and may store the characteristic data as a function that defines a curve shown as the solid line in FIG. 8.

Note that storage unit 218 may store only the characteristic data corresponding to PV panel 30 and power conditioner 50, and may store a plurality of characteristic data corresponding to a plurality of types of power conditioners and a plurality of types of PV panels that may be connected to transmission path 36.

Similar to arc determination unit 16 according to Embodiment 1, arc determination unit 216 is a processing unit that determines that an arc has occurred in transmission path 36 based on the voltage detected by voltage detector 14, when one or more particular frequency components of the current detected by current detector 12 exceed the first threshold. Arc determination unit 216 according to the present embodiment determines whether an arc has occurred in transmission path 36 further based on the result of a comparison of the relationship between the current and the voltage which have been detected, and the relationship shown in the characteristic data stored in storage unit 218, when the one or more particular frequency components exceed the first threshold.

[3-2. Operation]

Next, operation of arc detection circuit 210 according to the present embodiment is described with reference to the drawings.

Figure 9:
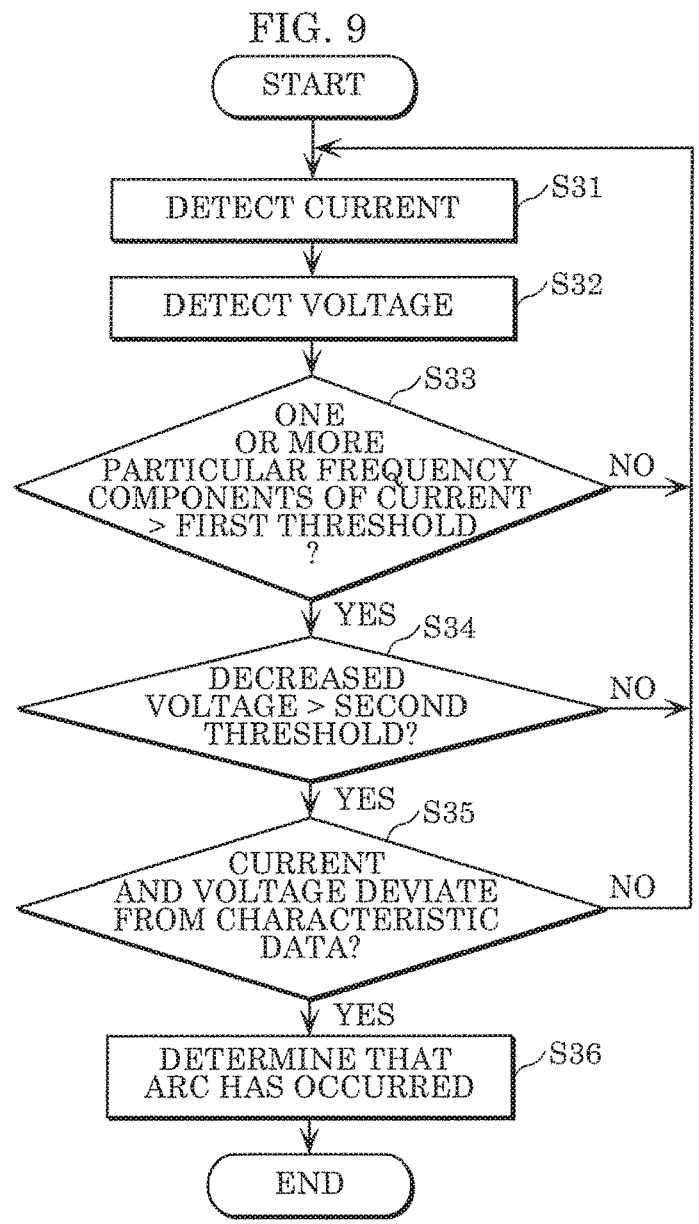
FIG. 9 is a flowchart illustrating an arc detection method performed by the arc detection circuit according to Embodiment 3.

FIG. 9 is a flowchart illustrating an arc detection method performed by arc detection circuit 210 according to the present embodiment.

Description of Steps S31 to S34 shown in FIG. 9 will be omitted, since they are the same as Steps S11 to S14 shown in FIG. 2. Hereinafter, each step after determination has been made in Step S34 shown in FIG. 9 will be described.

When arc determination unit 216 determines that the decreased voltage detected by voltage detector 14 is less than or equal to the second threshold (NO in S34), arc determination unit 216 determines that an arc has not occurred and the operation returns to Step S31. On the other hand, when the voltage detected by voltage detector 14 is greater than the second threshold (YES in S34), arc determination unit 216 compares i) the current detected by current detector 12 and the voltage detected by voltage detector 14 and ii) the relationships shown in the characteristic data stored in storage unit 218. In other words, it is determined whether the current and the voltage are on the curve of the solid line shown in FIG. 8 (S35). Here, when the difference between i) the current or the voltage and ii) the values on the curve shown in FIG. 8 is greater than or equal to 5%, the current and the voltage may be determined to deviate from the relationships shown in the characteristic data, for example.

When arc determination unit 216 determines that the current and the voltage do not deviate from the relationships indicated in the characteristic data (NO in S35), arc determination unit 216 determines that an arc has not occurred and the operation returns to Step S31.

On the other hand, when arc determination unit 216 determines that the current and the voltage deviate from the relationships indicated by the characteristic data (YES in S35), arc determination unit 216 determines that an arc has occurred (S36). When arc determination unit 216 determines that an arc has occurred, arc determination unit 16 outputs a signal to switch control circuit 42, similar to arc determination unit 16 according to Embodiment 1.

As described above, arc detection circuit 210 according to the present embodiment includes storage unit 218 configured to store characteristic data indicating relationships between input currents and input voltages from PV panel 30 to transmission path 36, and when the one or more particular frequency components exceed the first threshold, arc determination unit 216 is configured to determine that the arc has occurred in transmission path 36 further based on a result of a comparison between i) the voltage and the current and ii) the relationships indicated in the characteristic data.

As described above, arc detection circuit 210 also uses the characteristics of the input currents and the input voltages to transmission path 36 from PV panel 30 as a criterion, in addition to the two criteria concerning change in the frequency spectrum of the current which is specific to the case where an arc has occurred, and change in the voltage. This enables arc detection circuit 210 to detect occurrence of an arc still more accurately.

(Variation, etc.)

While the present invention has been described based on each embodiment above, the present invention is not limited to each of the above embodiments.

Figure 10:
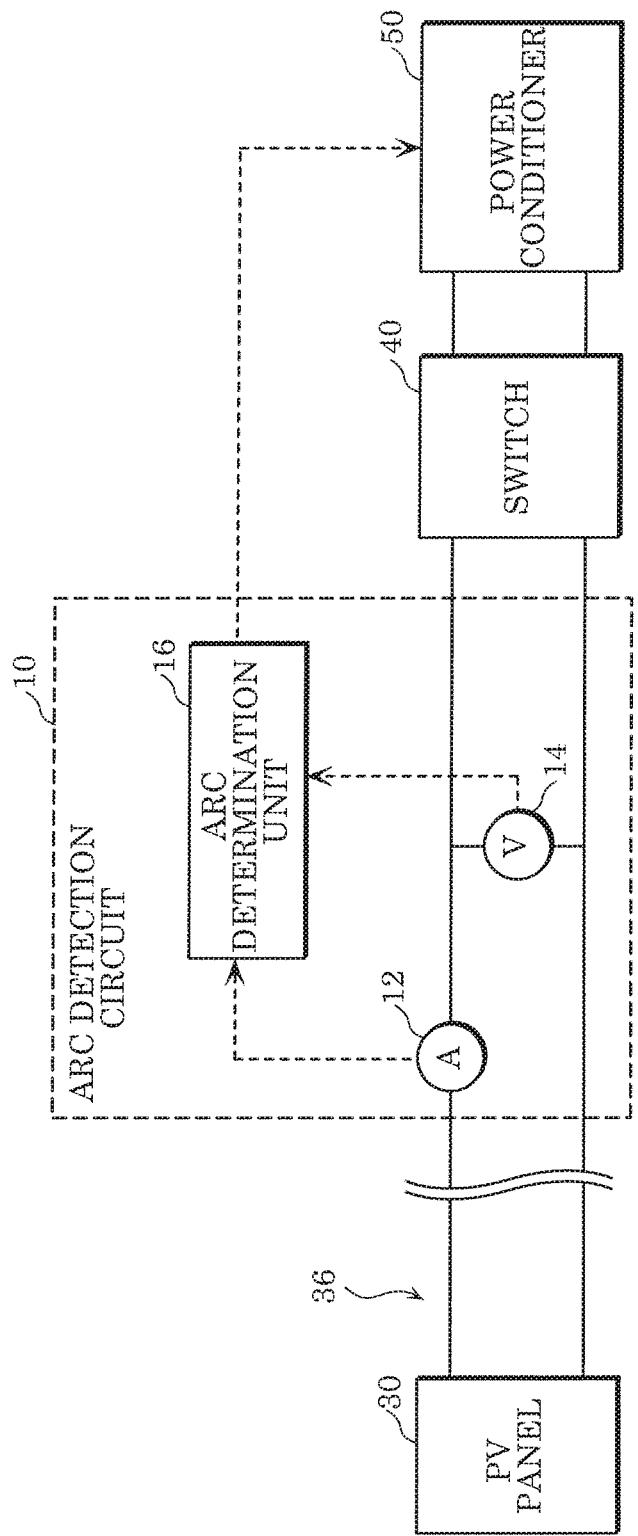
FIG. 10 is a block diagram illustrating another connection configuration of the arc detection circuit according to Embodiment 1.

For example, although the arc detection circuit according to each of the above embodiments outputs a signal to switch control circuit 42 and switches switch 40 to the open state, the signal from the arc detection circuit may be inputted to a device other than switch control circuit 42. Such a variation will be described with reference to the drawings. FIG. 10 is a block diagram illustrating another connection configuration of arc detection circuit 10 according to Embodiment 1. As illustrated in FIG. 10, arc detection circuit 10 may output a signal to power conditioner 50. Power conditioner 50 may stop the operation or interrupt the power inputted from transmission path 36, in response to the signal from the arc detection circuit. Accordingly, supply of the power from PV panel 30 to power conditioner 50 can be stopped when an arc has occurred.

Moreover, one aspect of the present invention may be implemented as a switch system including the arc detection circuit according to each of the above embodiments, and switch 40 that is controlled based on the signal outputted from the arc detection circuit. Furthermore, switch 40 may include the arc detection circuit.

Moreover, one aspect of the present invention may be implemented as a power conditioner system including the arc detection circuit according to each of the above embodiments and power conditioner 50 to which power from the power supply apparatus is supplied via transmission path 36. Furthermore, power conditioner 50 may include the arc detection circuit.

Although the arc detection circuit according to each of the above embodiments is implemented as software using a microcontroller unit, the arc detection circuit may be implemented as software in a general purpose computer, such as a personal computer. Furthermore, the arc detection circuit may be implemented as hardware by using a dedicated electronic circuit including an A to D converter, a logical circuit, a gate array, a D to A converter, and so on.

The scope of the present invention may also include embodiments as a result of adding various modifications to each of the embodiments that may be conceived by those skilled in the art, and embodiments obtained by combining the structural elements and functions in each of the embodiments in any manner as long as the combination does not depart from the scope of the present invention.

The invention claimed is:

1. An arc detection circuit, comprising:
   a current detector that detects a current supplied from a power supply apparatus via a transmission path;
   a voltage detector that detects a voltage applied to the transmission path; and
   an arc determination unit configured to determine whether an arc has occurred in the transmission path based on the voltage, when one or more particular frequency components of the current exceed a first threshold, wherein
   the arc determination unit is configured to determine that the arc has occurred when a decreased voltage is greater than a second threshold, the decreased voltage being a difference between i) a voltage at a timing immediately before a timing at which the one or more particular frequency components of the current exceed the first threshold and ii) a voltage at a timing immediately after the timing at which the one or more particular frequency components of the current exceed the first threshold.

2. The arc detection circuit according to claim 1, wherein
   a direct-current power output from the power supply apparatus is supplied via the transmission path to a power conditioner that converts the direct-current power into an alternating-current power,
   the arc detection circuit includes a storage unit configured to store characteristic data indicating relationships between input currents and input voltages from the power supply apparatus to the transmission path, and
   when the one or more particular frequency components exceed the first threshold, the arc determination unit is configured to determine that the arc has occurred in the transmission path further based on a result of a comparison between i) the voltage and the current and ii) the relationships indicated in the characteristic data.

3. The arc detection circuit according to claim 1, wherein
   the arc determination unit is configured to: calculate a quantity of heat generated in the transmission path after a point in time when the one or more particular frequency components are detected to exceed the first threshold, based on the voltage, the current, and a time elapsed from the point in time; and determine whether the arc has occurred in the transmission path based on a result of a comparison between the quantity of heat and a third threshold.

4. A switch system, comprising:
   the arc detection circuit according to claim 1; and a switch that is controlled based on a signal outputted from the arc detection circuit.

5. A power conditioner system, comprising:

the arc detection circuit according to claim 1; and a power conditioner to which power from the power supply apparatus is supplied via the transmission path.

6. An arc detection method, comprising:

detecting a current supplied from a power supply apparatus via a transmission path;

detecting a voltage applied to the transmission path; and determining that an arc has occurred in the transmission path based on the voltage, when one or more particular frequency components of the current exceed a first threshold, wherein the determining includes determining that the arc has occurred when a decreased voltage is greater than a second threshold, the decreased voltage being a difference between i) a voltage at a timing immediately before a timing at which the one or more particular frequency components of the current exceed the first threshold and ii) a voltage at a timing immediately after the timing at which the one or more particular frequency components of the current exceed the first threshold.

7. An arc detection circuit, comprising:

a current detector that detects a current supplied from a power supply apparatus via a transmission path;

a voltage detector that detects a voltage applied to the transmission path; and an arc determination unit configured to determine whether an arc has occurred in the transmission path based on the voltage, when one or more particular frequency components of the current exceed a first threshold, wherein the arc determination unit is configured to: calculate a quantity of heat generated in the transmission path after a point in time when the one or more particular frequency components are detected to exceed the first threshold, based on the voltage, the current, and a time elapsed from the point in time; and determine whether the arc has occurred in the transmission path based on a result of a comparison between the quantity of heat and a third threshold.

* * * * *